(12) United States Patent
Kim et al.

(10) Patent No.: US 8,743,628 B2
(45) Date of Patent: Jun. 3, 2014

(54) LINE DRIVER CIRCUITS, METHODS, AND APPARATUSES

(75) Inventors: Tae H. Kim, Boise, ID (US); Howard C. Kirsch, Eagle, ID (US); Yu-Wen Huang, Boise, ID (US); Mingshiang Wang, Boise, ID (US); Todd A. Merritt, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 190 days.

(21) Appl. No.: 13/204,994

(22) Filed: Aug. 8, 2011

(65) Prior Publication Data

US 2013/0039132 A1    Feb. 14, 2013

(51) Int. Cl.
*G11C 7/00* (2006.01)

(52) U.S. Cl.
USPC ............. 365/189.11; 365/185.23; 365/230.06

(58) Field of Classification Search
USPC ............................ 365/189.11, 185.23, 230.06
See application file for complete search history.

(56) References Cited

U.S. PATENT DOCUMENTS

| | | | |
|---|---|---|---|
| 6,819,621 B2 | 11/2004 | Koelling et al. | |
| 6,841,826 B2 | 1/2005 | Dokumaci et al. | |
| 7,593,272 B2 | 9/2009 | Doyle et al. | |
| 7,639,066 B2 | 12/2009 | Harald | |
| 7,746,720 B2 | 6/2010 | Derner et al. | |
| 7,839,714 B2* | 11/2010 | Sugawara | 365/230.06 |
| 2003/0223272 A1 | 12/2003 | Mihnea et al. | |
| 2007/0262395 A1 | 11/2007 | Gibbons et al. | |
| 2008/0031060 A1* | 2/2008 | Choi et al. | 365/189.11 |
| 2010/0008165 A1 | 1/2010 | Macerola et al. | |
| 2010/0061167 A1* | 3/2010 | Kim et al. | 365/194 |
| 2010/0128534 A1 | 5/2010 | Moschiano et al. | |

* cited by examiner

*Primary Examiner* — Anthan Tran
(74) *Attorney, Agent, or Firm* — Dickstein Shapiro LLP (57) ABSTRACT

Described embodiments are directed to line drivers, such as those for providing reduced gate induced drain leakage in a memory array. Corresponding methods of operation of line drivers are also disclosed.

38 Claims, 6 Drawing Sheets

FIG. 1

Prior Art

LINE DRIVER CIRCUITS, METHODS, AND APPARATUSES

FIELD OF TECHNOLOGY

Described embodiments relate to memory arrays, and more particularly, to line drivers for memory arrays.

BACKGROUND

Memory devices typically include memory arrays having many memory cells, where each memory cell is configured to hold an electrical charge that represents data, such as one or more bits of data or a portion of a bit of data. Memory devices may include, for example, RAM, SRAM, DRAM, PRAM, SDRAM, and other types of memory devices. Access operations for such memory devices include write and read operations. External data is stored in the memory cells during a write operation. The stored data is retrieved from the memory cells during a read operation.

Memory arrays of memory devices are typically arranged into rows and columns of memory cells. A memory array typically includes a number of control lines, often referred to as "word lines," each of which connects to one or more corresponding rows of memory cells. A control line may include, for example, a global word line, a local word line, or other types of control lines, as described further below. A memory array also typically includes a number of data lines, often referred to as "bit lines," where each bit line connects to one or more corresponding columns of memory cells. In this manner, each given memory cell in a memory array is connected to at least one control line and at least one bit line. During a memory access operation, the memory device controls a voltage on a respective word line to access a memory cell on the control line, and either stores data to the memory cell or retrieves data from the memory cell using the respective bit line.

Each control line in a conventional memory array typically receives a voltage during a memory operation from a corresponding line driver. In an "active low" configuration, the voltage provided on a control line is a logic low voltage when the control line is active, and is a logic high voltage when the control line is inactive. Alternatively, in an "active high" configuration, the voltage provided on the control line is a logic high voltage when the control is active, and a logic low voltage when the control line is inactive. For example, in an active high configuration, a line driver may drive a corresponding control line to a positive voltage during a memory access operation of one of the memory cells connected to the word line. When a memory access operation is not being performed on a memory cell connected to the control line, the corresponding control line driver drives the control line to a lower positive voltage, a negative voltage, or a ground voltage, as described further below.

In some cases, control lines of a memory array may include global word lines and local word lines. For example, a memory array may be arranged as one or more memory blocks, with each memory block including a set of local word lines connected to rows of memory cells within the memory block and configured to provide a word line voltage WL to the memory cells. Each of the local word lines may be driven by a corresponding local word line driver. The local word lines found in each memory block are typically identical. For example, if a first memory block in a memory array includes a set of local word lines WL_0-WL_N, then another memory block in the memory array also typically includes a similar set of local word lines WL_0-WL_N. Thus, respective sets of local word line drivers in multiple memory blocks may be driven by a single set of global word lines GWL_0-GWL_N by selectively connecting the set of global word lines to one or more sets of local word lines. Each global word line is driven by a global word line driver that provides a line voltage, such as a global row falling (GRF) edge enable voltage, to the global word line. In some cases, the voltage provided by the global word line driver may be inverted at the local word line driver, with the inverted logic voltage being output as the local word line voltage.

A memory array operates in various modes, such as an active mode, when at least one word line in the memory array is being used to access the memory array, and an inactive mode (for example, a standby mode), when no word lines are being used to access the memory array. The memory array may enter an inactive mode, for example, when performing a static refresh operation or other operation when accessing cells of the memory array is not desirable or required.

When the memory array is in an active mode, a single word line is typically being used to access a memory cell in the memory array at any one time. When at least one of the word lines connected to the memory array is being used to access a memory cell (e.g., if any one word line is active), it is desirable to couple other word lines of the memory array (e.g., the inactive word lines) to a negative word line voltage. By connecting the inactive word lines to the negative voltage, sub-threshold leakage across the memory cells connected to these inactive word lines is reduced.

While connecting the inactive word lines to the negative voltage during an active period reduces sub-threshold leakage, it disadvantageously increases a gate induced drain leakage (GIDL) of components in the memory array. In a transistor, GIDL is generally caused by a high gate-to-drain electric field in the region of the gate that overlaps the drain. For example, an NMOS transistor may experience GIDL when a potential at its source/drain is substantially greater than a potential at its gate. Similarly, a PMOS transistor may experience GIDL when a potential at its source/drain is substantially lower than a potential at its gate.

Accordingly, when a memory array is in an inactive mode, such that no word lines are being used to access memory cells in the memory array, it is desirable to drive the word lines to a standby voltage, which may be, for example, a ground voltage or a positive voltage. To this end, a line driver may function as a voltage selection circuit configured to selectably couple a word line to either a first voltage level, such as a negative voltage level, during an active period where at least one of the word lines connected to an array are active, and to a second voltage level, such as a positive or ground voltage level, during an inactive period when each of the word lines are inactive.

Figure 1:
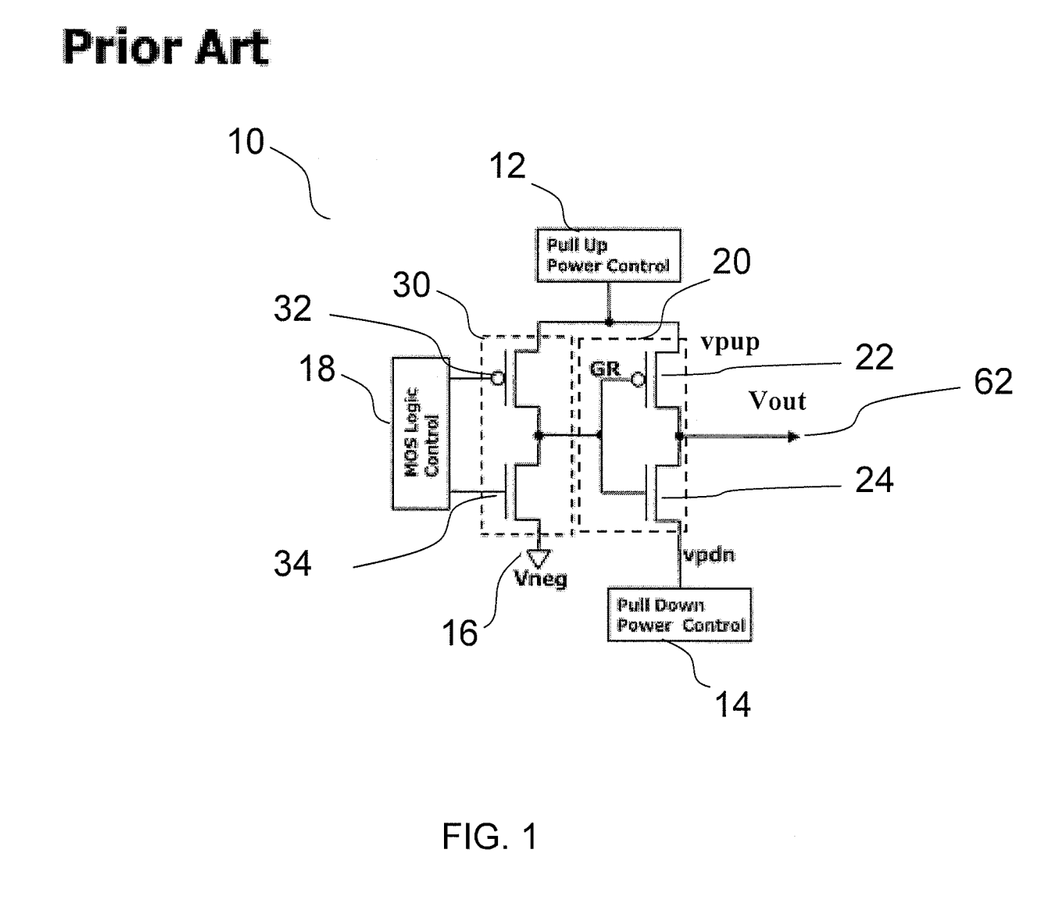
FIG. 1 is a schematic diagram of a conventional line driver.

FIG. 1 shows a conventional line driver 10 for a memory array, which may be used, for example, as a global word line driver. Line driver 10 includes a pull up power control circuit 12 that is configured to provide (e.g., output, generate, establish, etc.) a pull-up voltage, shown in FIG. 1 as voltage vpup. Line driver 10 also includes a pull down power control circuit 14 configured to output a pull-down voltage, shown in FIG. 1 as vpdn.

Pull-up power control circuit 12 may be configured to output a first pull-up voltage when the corresponding memory array is in an active mode and a second pull-up voltage when the corresponding array is in an inactive mode. For example, pull-up power control circuit 12 may be configured to output a first bias voltage vccp, which may be, for example, approximately 3.0 V, during an active period, and a second bias voltage vccprdec (Vccp Row Decode), which may be, for example, approximately 2.5 V, during an inactive period.

Pull-down power control circuit 14 outputs a first pull-down voltage when the corresponding memory array is in an active mode (e.g., when at least one word line driver of the memory array is performing a memory access operation), and a second pull-down voltage when the memory array is in an inactive mode (e.g., when no word line drivers of the memory array are performing a memory access operation, such as during a static refresh operation). For example, pull-down power control circuit 14 may be configured to output a negative pull-down voltage vneg, which may be, for approximately −0.3 V, during an active period, and a standby pull-down voltage, which may be, for example, approximately 1 V during an inactive period. As described further below, a negative voltage source 16 configured to provide negative pull-down voltage vneg to pull-down power control circuit 14 may also be configured to provide vneg as a gate voltage to gate voltage selection circuit 30 (described further below).

Line driver 10 includes a voltage selection circuit 20 configured to output a line driver output voltage Vout to a control line 62 (for example, a global word line or a local word line). Voltage selection circuit 20 includes a pull-up transistor 22, which may be a PMOS transistor, and a pull-down transistor 24, which may be an NMOS transistor. Pull-up transistor 22 and pull-down transistor 24 are coupled in series, with a first source/drain of pull-up transistor 22 coupled to pull-up power control circuit 12 and a second source/drain of pull-up transistor 22 coupled to a first source/drain of pull-down transistor 24 and control line 62. A second source/drain of pull-down transistor 24 is coupled to pull-down power control circuit 14. The respective gates of pull-up transistor 22 and pull-down transistor 24 share a common node that receives a gate voltage GR from a gate voltage selection circuit 30.

Gate voltage GR is controlled by gate voltage selection circuit 30 and a logic control circuit 18. Gate voltage selection circuit 30 includes first and second gate voltage selection transistors 32, 34. First gate voltage selection transistor 32 may be a PMOS transistor having a first source/drain coupled to pull up power control circuit 12 and a second source/drain coupled to a node providing gate voltage GR. Second gate voltage selection transistor 34 may be an NMOS transistor 34 having a first source/drain coupled to the node providing gate voltage GR and a second source/drain coupled to a negative voltage source 16. Negative voltage source 16 may be, for example, equal to the negative pull-down voltage vneg, and the negative voltage source 16 may be used to provide the negative pull-down voltage vneg to pull-down power control circuit 14.

During an active period of the memory array when line driver 10 is activating a word line to perform a memory access operation on a memory cell, logic control circuit 18 controls gate voltage selection circuit 30 to provide pull-up voltage vpup (e.g., vccprdec) as the gate voltage GR. During an active period of the memory array when line driver 10 is not activating a word line to perform a memory access operation on a memory cell (e.g., when at least one other word line driver of the memory array is active), logic control circuit 18 controls gate voltage selection circuit 30 to provide negative voltage vneg from negative voltage source 16 as the gate voltage GR. During an inactive period of the memory array (e.g., when no word line drivers of the memory array are active), logic control circuit 18 controls gate voltage selection circuit 30 to provide negative voltage vneg from negative voltage power source 16 as the gate voltage GR. Voltage selection circuit 20 is configured to output pull-up voltage vpup (e.g., vccprdec) to control line 62 when gate voltage GR is a negative voltage, such as vneg. Voltage selection circuit 20 is configured to output pull-down voltage vpdn (e.g., a ground or positive voltage) to control line 62 when gate voltage GR is a positive voltage, such as vpup.

Line driver 10 may be configured to act as a global word line driver for a word line of a memory array, where the output voltage Vout provided to control line 62 acts as a global word line voltage that may be inverted at a local word line driver. In this case, line driver 10 acts as a global word line driver for a memory array in an active high configuration, outputting a low logic voltage (i.e., pull-down voltage vpdn) to control line 62 as voltage Vout in order to drive a corresponding local word line driver of a word line to output a high logic value to a local word line in order to perform a memory access operation on a memory cell.

Figure 2:
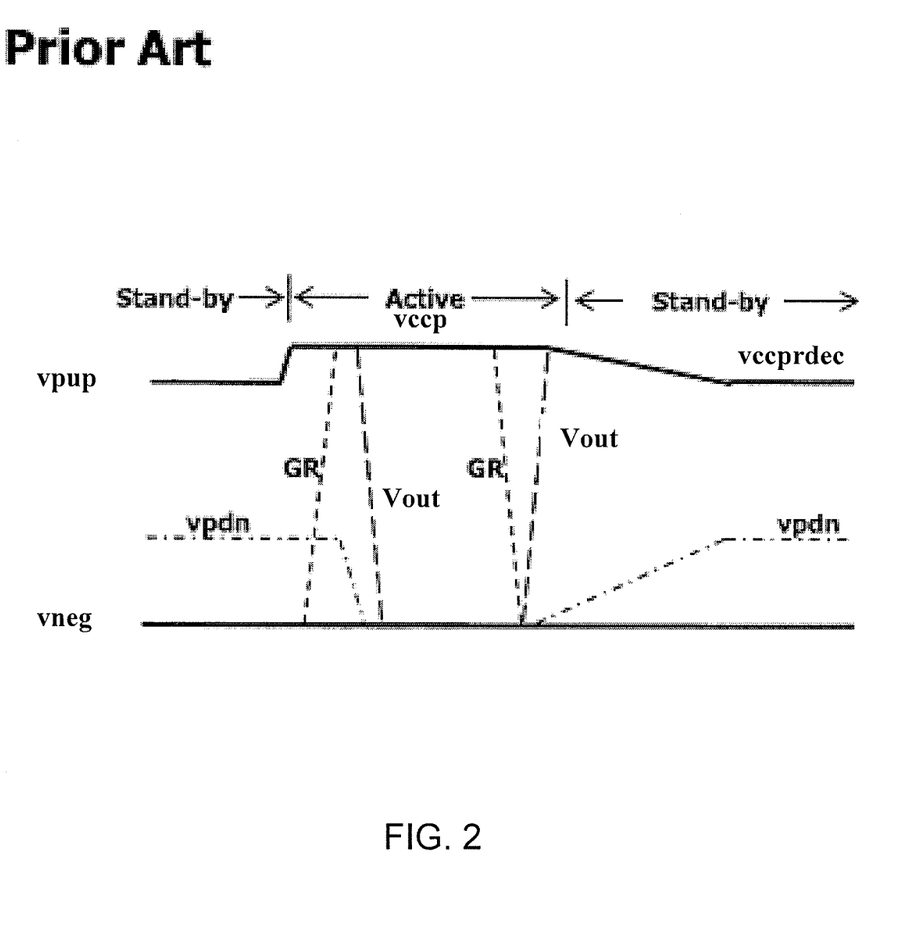
FIG. 2 is a timing diagram illustrating voltage levels during an operation of a conventional line driver.

FIG. 2 illustrates voltage levels corresponding to various nodes within the conventional line driver 10 during inactive and active periods of a corresponding memory array. For example, conventional line driver 10 may be a global word line driver for a memory array having an active high configuration, where the output voltage Vout of line driver 10 acts as a global word line voltage that drives a local word line driver and is inverted at the local word line driver.

During an inactive period of the memory array, logic control circuit 18 outputs a logic high control signal to first and second gate voltage selection transistors 32, 34, such that negative pull-up voltage vneg (e.g., −0.3 V) is provided as gate voltage GR to the respective gates of pull-up transistor 22 and pull-down transistor 24. Providing vneg as gate voltage GR causes pull-up transistor 22 to conduct, providing vpup (e.g., vccprdec, which may be approximately 2.5 V) as line driver output voltage Vout at control line 62.

During an active period where line driver 10 is being used to drive a corresponding local word line driver to perform a memory access operation on a memory cell, logic control circuit 18 outputs a logic low control signal to first and second gate voltage selection transistors 32, 34, such that pull-up voltage vpup (e.g., vccp, which may be approximately 3.0 V) is provided as gate voltage GR to the respective gates of pull-up transistor 22 and pull-down transistor 24. Providing pull-up voltage vpup as gate voltage GR causes pull-down transistor 24 to conduct, providing vpdn (e.g., vneg) as line driver output voltage Vout at control line 62.

As discussed above, during an inactive period of the line driver 10 described in connection with FIGS. 1 and 2 above, the gate voltage GR of both pull-up transistor 22 and pull-down transistor 24 is equal to negative voltage vneg, which may be, for example, approximately −0.3 V. If vccprdec is, for example, approximately 2.5 V during an inactive period, this results in a voltage differential between the gate and both source/drains of pull-up transistor 22 of approximately 2.8 V. The gate and the source/drain of pull-down transistor 24 that is connected to control line 62 also includes a voltage differential of approximately 2.8 V. This voltage differential may result in undesirable GIDL during the inactive period, as well as undesirable stress on pull-up transistor 22 and/or pull-down transistor 24.

Accordingly, it is desirable to provide apparatuses and corresponding methods of operation that reduce sub-threshold leakage experienced during an active period of operation of a memory array line driver while reducing GIDL and device stress experienced during an inactive period of the line driver.

DETAILED DESCRIPTION

In the following detailed description, reference is made to various embodiments. These embodiments are described with sufficient detail to enable those skilled in the art to practice them. It is to be understood that other embodiments may be employed, and that various structural, logical and electrical changes may be made. In addition, reference is made to various processes including multiple steps. It should be understood that these steps need not be performed in the order that they are listed, unless specifically stated as such.

Described embodiments include memory arrays having a line driver, such as those configured to provide reduced gate induced diode leakage (GIDL) and device stress. In at least some of the described line drivers, a source/drain of a transistor in the gate voltage selection circuit is configured to receive a ground or positive-level pull-down voltage during an inactive period of the memory array, thereby providing the ground or positive-level pull-down voltage to a gate of transistors in a voltage selection circuit during the inactive period. In an embodiment, the source/drain of the transistor in the gate voltage selection circuit may be coupled to a source/drain of a pull-down transistor in the voltage selection circuit, or to a pull-down power control circuit that is connected to the source/drain of the pull-down transistor. In either case, the source/drain of the transistor in the gate voltage selection circuit may be referred to as being "commonly coupled with" the source/drain of the pull-down transistor in the voltage selection circuit. The described concepts may be applied to one or more local word line drivers, one or more global word line drivers, one or more data line drivers, or some combination thereof in a memory array.

Figure 3:
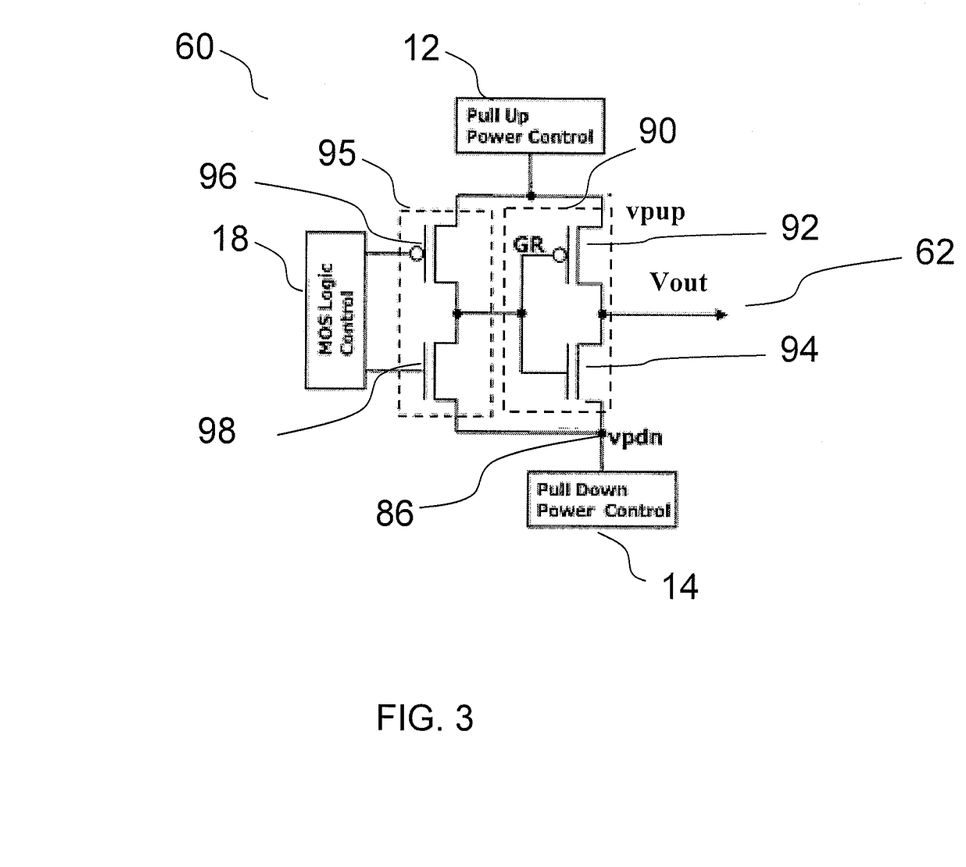
FIG. 3 is a schematic diagram of a line driver in accordance with embodiments described herein.

FIG. 3 is a schematic diagram of a line driver 60 for a memory array, such as a global word line driver, in accordance with embodiments described herein. Line driver 60 includes a pull up power control circuit 12 that is configured to output a pull-up voltage, shown in FIG. 3 as voltage vpup. Line driver 60 also includes a pull down power control circuit 14 configured to output a pull-down voltage, shown in FIG. 3 as vpdn. Pull-up power control circuit 12 may be configured to output a first pull-up voltage (e.g., vccp) when an array corresponding to the line driver 60 (e.g., memory array 150 in FIG. 5) is in an active mode, and a second pull-up voltage (e.g., vccprdec) when the array is in an inactive mode. Pull-down power control circuit 14 may be configured to output a first pull-down voltage (e.g., vneg) when the array corresponding to line driver 60 is in an active mode, and a second pull-down voltage (e.g., a ground or positive voltage) when the array is in an inactive mode.

Figure 6:
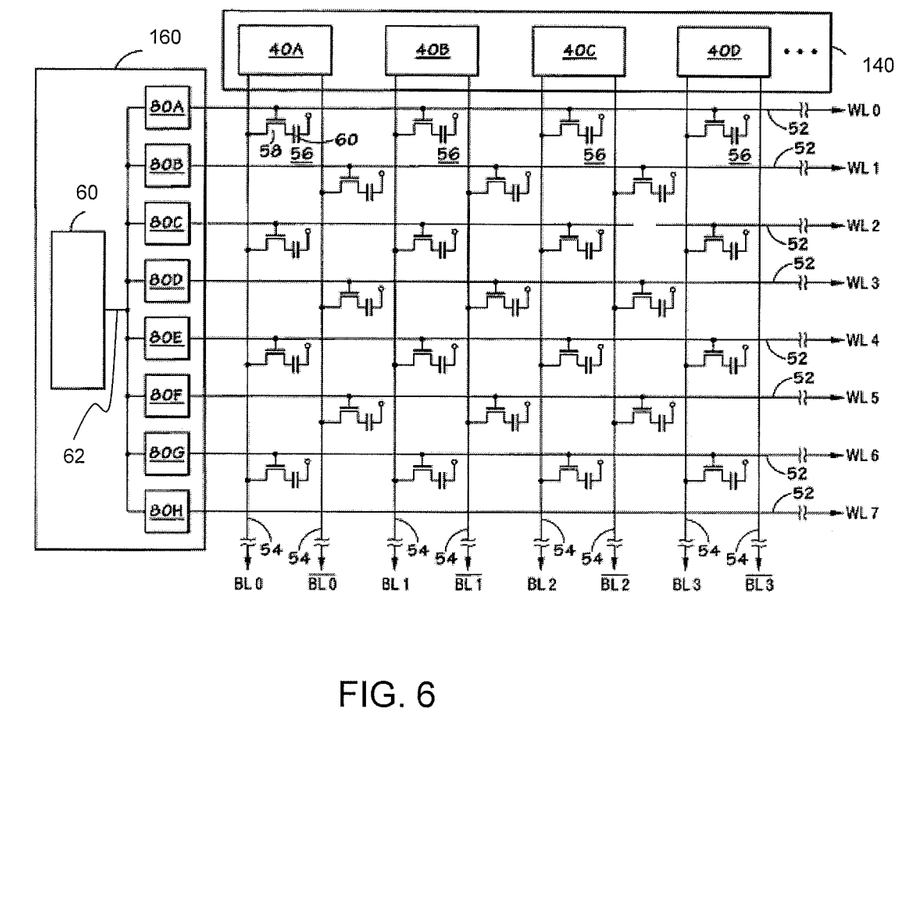
FIG. 6 is a block diagram of a memory array that may be used in a memory device including at least one line driver in accordance with embodiments described herein.

Line driver 60 includes a voltage selection circuit 90 comprised of a pull-up transistor 92, which may be a PMOS transistor, and a pull-down transistor 94, which may be an NMOS transistor. Pull-up transistor 92 and pull-down transistor 94 may be coupled in series, with a first source/drain of pull-up transistor 92 coupled to pull-up power control circuit 12 and a second source/drain of pull-up transistor 92 coupled to a first source/drain of pull-down transistor 94. A second source/drain of pull-down transistor 94 may be coupled to pull-down power control circuit 14. The respective gates of pull-up transistor 92 and pull-down transistor 94 may share a common node and receive a gate voltage GR from a gate voltage selection circuit 95. The second source/drain of pull-up transistor 92 and the first source/drain of pull-down transistor 94 are coupled to a control line 62, upon which a line driver output voltage Vout is output. In an embodiment where line driver 60 serves as a global word line driver, control line 62 is a global word line that provides voltage Vout to one or more local word line drivers 80A-H (FIG. 6), which drives the local word line drivers 80A-H to output a word line voltage WL to a local word line 52 connected to a row of memory cells 56 of a memory array 150 (FIG. 6). In an embodiment where line driver 60 serves as a local word line driver, control line 62 is a local word line connected to a row of memory cells 56, and voltage Vout may serve as a word line voltage WL.

Gate voltage GR at the gate of pull-up transistor 92 and pull-down transistor 94 is controlled by gate voltage selection circuit 95 and a logic control circuit 18. Gate voltage selection circuit 95 includes first and second gate voltage selection transistors 96, 98. First gate voltage selection transistor 96 may be a PMOS transistor having a first source drain coupled to pull-up power control circuit 12 and a second source/drain coupled to a node providing gate voltage GR. Second gate voltage selection transistor 98 may be an NMOS transistor having a first source/drain coupled to the node providing gate voltage GR. A second source/drain of second gate voltage selection transistor 98 is coupled to a common node 86 with the second source/drain of pull-down transistor 94 and pull-down power control circuit 14. In other embodiments, the second source/drain of second gate voltage selection transistor 98 may be coupled directly to pull-down power control circuit 14. In either case, the second source/drain of second gate voltage selection transistor 98 may be referred to as being "commonly coupled with" the source/drain of pull-down transistor 94.

During an active period of the memory array when line driver 60 is activating a word line to perform a memory access operation on a memory cell, logic control circuit 18 can be configured to control gate voltage selection circuit 95 to provide pull-up voltage vpup (e.g., vccprdec) from pull-up power control circuit 12 as the gate voltage GR. During an active period of the memory array when line driver 60 is not activating a word line to perform a memory access operation (e.g., when at least one other line driver of the memory array is active), logic control circuit 18 controls gate voltage selection circuit 95 to provide pull-down voltage vpdn (e.g., vneg) from pull-down power control circuit 14 as the gate voltage GR.

During an inactive period, logic control circuit 18 controls gate voltage selection circuit 95 to provide pull-down voltage vpdn (e.g., a ground or positive voltage) from pull-down power control circuit 14 (e.g., via node 86 of the second source/drain of pull-down transistor 94) as the gate voltage GR. Voltage selection circuit 90 is configured to output pull-up voltage vpup (e.g., vccprdec) to control line 62 when pull-down voltage vpdn (e.g., a ground or positive voltage) is applied as the gate voltage GR. Voltage selection circuit 90 is configured to output pull-down voltage vpdn (e.g., vneg) to control line 62 when pull-up voltage vpup (e.g., vccp) is applied as the gate voltage GR.

Figure 4:
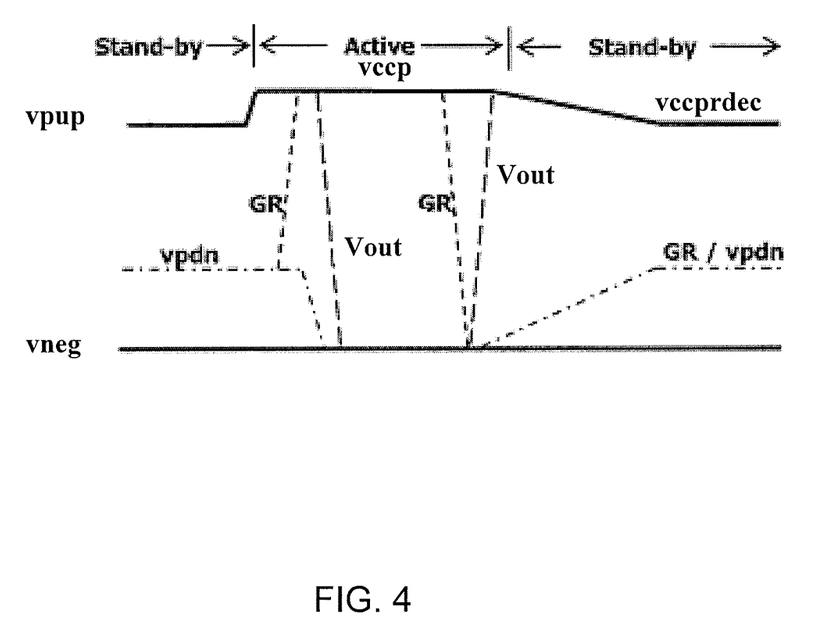
FIG. 4 is a timing diagram illustrating voltage levels during an operation of a line driver in accordance with embodiments described herein.

FIG. 4 illustrates voltage levels corresponding to various nodes within line driver 60 during active and inactive periods. These periods are described further below in connection with the schematic diagram shown in FIG. 3. For example, line driver 60 may be a global word line driver for a memory array having an active high configuration, where the output voltage Vout of line driver 60 acts as a global word line voltage that drives a local word line driver and is inverted at the local word line driver. It should be understood, however, that other applications of line driver 60, such as in an active low configuration and/or as a local word line driver, are also within the scope of the disclosure.

During an active period of the memory array when line driver 60 is activating a word line to perform a memory access operation on a memory cell, logic control circuit 18 outputs a logic low control signal to first and second gate voltage selection transistors 96, 98, such that pull-up voltage vpup (e.g., vccp, which may be approximately 3.0 V) is provided as gate voltage GR to the respective gates of pull-up transistor 92 and pull-down transistor 94. Providing pull-up voltage vpup as gate voltage GR causes pull-down transistor 94 to conduct, providing vpdn (e.g., vneg) as line driver output voltage Vout at control line 62.

During an inactive period (for example, a standby period), logic control circuit 18 outputs a logic high control signal to first and second gate voltage selection transistors 96, 98 such that pull-down voltage vpdn (e.g., a ground or positive voltage that is less than vpup) is provided as gate voltage GR to the respective gates of pull-up transistor 92 and pull-down transistor 94. Providing vpdn as gate voltage GR causes pull-up transistor 92 to conduct, providing vpup (e.g., vccprdec, which may be approximately 2.5 V) as line driver output voltage Vout at control line 62.

Unlike in conventional word line drivers, gate voltage GR of line driver 60 is not biased to a negative voltage during the inactive period. As shown in FIG. 4, the gate voltage GR substantially corresponds with pull-down voltage vpdn during the inactive period, and increases to voltage vccp during the active period. It should be understood that the gate voltage GR experienced at the gates of pull-up transistor 92 and pull-down transistor 94 may not be exactly identical to the pull-down voltage vpdn that is output by pull-down power control circuit 14 due, for example, to depletion of the voltage across second gate voltage selection transistor 98 and other elements. Accordingly, the gate voltage GR may be considered to be "substantially the same" as the pull down voltage vpdn. While gate voltage GR may temporarily be reduced to negative pull-down voltage GR during a conclusion of the active period, this voltage level is temporary, as gate voltage GR returns to correspond with the ground or positive pull-down voltage vpdn during the subsequent inactive period. The respective gates and source/drains of pull-up transistor 92 and pull-down transistor 94 thus experience a lower voltage differential during the inactive period, which in turn reduces GIDL and component stress for transistors 92 and 94.

The pull-up voltage vpup that is output by pull-up power control circuit 12 during the inactive period (i.e., vccprdec) may be, for example, equal to approximately 2.5 V, the pull-up voltage that is output by pull-up power control circuit 12 during the active period (i.e., vccp) may be, for example, equal to approximately 3.0 V. The pull-down voltage vpdn that is output by pull-down power control circuit 14 during the inactive period may be, for example, equal to approximately 1.0 V, and the pull-down voltage vpdn that is output by pull-down power control circuit 14 during the active period (i.e., vneg) may be, for example, equal to approximately −0.3 V. In another embodiment, the pull-down voltage vpdn that is output by pull-down power control circuit 14 during the inactive period may correspond to a ground voltage level. It should be understood that the pull-down voltage vpdn that is output by pull-down power control circuit 14 during the inactive period will be lower than the pull-up voltage vpup that is output by pull-up power control circuit 12 during either the inactive period (i.e., vccprdec) or the active period (i.e., vccp), and sufficiently low such that pull-up transistor 92 is configured to conduct when receiving the voltage at its gate.

Figure 5:
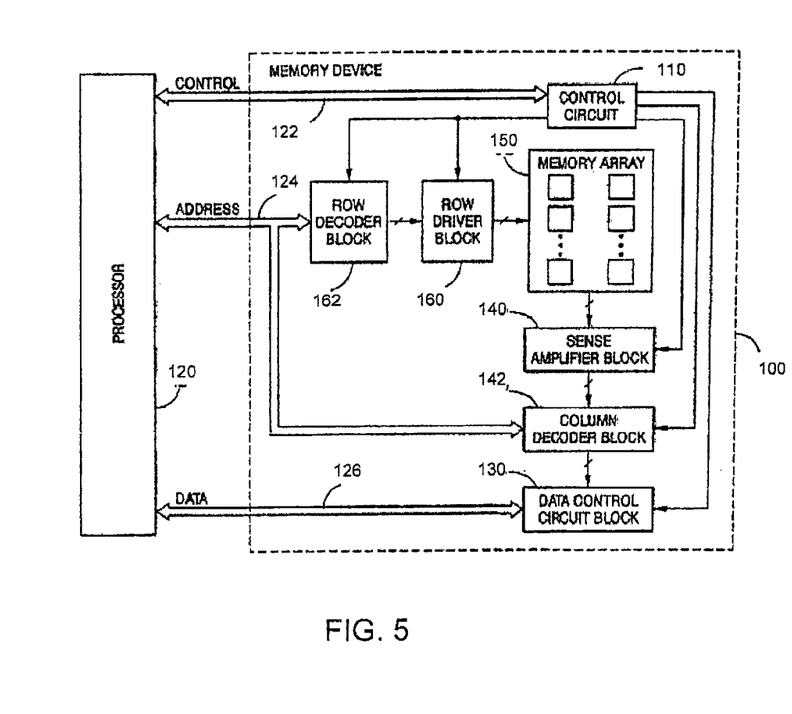
FIG. 5 is a block diagram of a memory device including at least one line driver in accordance with embodiments described herein.

FIG. 5 is a block diagram of a memory device 100 that may be implemented with at least one of the line drivers 80 described in connection with FIGS. 3 and 4. Memory device 100 may be part of a memory system, such as a computer or other electronic system that includes a memory device, and connected to a processor 120 via a control bus 122, an address bus 124, and a data bus 126. Accordingly, both memory device 100 and a memory system including such a memory device may each be referred to as an apparatus. In another embodiment, processor 120 may be integrated into memory device 100.

Memory device 100 includes a memory array 150 with memory cells arranged into rows and columns. To access memory array 150, a row decoder block 162 and a column decoder block 142 are provided and are configured to receive and translate address information from a processor 120 via address bus 124. Row decoder block 162 and column decoder block 142 interpret the address information to determine a particular memory cell (i.e., a row and column address) in the memory array 150 to access. A sense amplifier block 140 having a plurality of sense amplifiers (e.g., one sense amplifier corresponding to one or more column lines in memory array 150) is also provided between the column decoder 142 and the memory array 150. The amplifiers of sense amplifier block 140 sense and amplify individual values stored in the memory cells of memory array 150.

Memory device 100 also includes a row driver block 160 between row decoder block 162 and memory array 150. Row driver block 160 may include one or more global word line drivers and/or local word line drivers to drive selected control lines of memory array 150 according to a given row address. In some embodiments, some or all line drivers of memory array 150 may be configured as line driver 60 described above in connection with FIG. 3. Alternatively, some line drivers of memory array 150 may be configured as conventional word line drivers, such as line driver 10 described above in connection with FIG. 1 or other line drivers known in the art.

During read and write operations in memory device 100, data may be transferred to and from memory device 100 via data bus 126. Data bus 126 may be, for example, a 16-bit data bus configured to carry data at 400 MHz. The coordination of the data received on data bus 126 and the address information for writing and/or reading the data, which is received on address bus 124, may be conducted through a data control circuit block 130. Memory device 100 may also include a control circuit 110 configured to receive control signals from processor 120 via control bus 122. Control circuit 110 is coupled to row decoder block 162, column decoder block 142, sense amplifier block 140, row driver block 160, and data control circuit block 130, and is configured to coordinate timing and control among the various circuits in the memory device 100.

FIG. 6 is a block diagram of a memory array 150, such as may be used in connection with memory device 100 (FIG. 5).

Memory array 150 may be, for example, a DRAM memory array, or another type of memory array known in the art.

Memory array 150 includes multiple rows of memory cells 56 connected to local word lines 52, which are respectively labeled as WL0 through WL7 in FIG. 6. Memory array also includes multiple columns of bit lines 54, which may be arranged into complimentary bit line pairs that are labeled as BL0 and $\overline{BL0}$ through BL3 and $\overline{BL3}$ in FIG. 6. Each complimentary pair of bit lines is electrically coupled to a sense amplifier 40A-D in sense amplifier block 140. It should be understood that, while FIG. 6 only shows a limited number of rows and columns of memory cells in memory array 150 for purposes of clarity, typically memory array 150 would include hundreds or thousands of rows and columns of memory cells.

In the particular type of memory cells shown in memory array 150, each memory cell 56 includes an access device 58, such as a transistor, and a storage device 60, such as a capacitor. Each access device 58 is coupled to a respective local word line 52, and each storage device 60 is coupled to a respective data line 54. Information is stored in a memory cell 56 in the form of an electrical charge by applying a first voltage to the gate of the access device 58 via the respective local word line 52 to open the access device 58, and applying a second voltage to the storage device 60 via data line 54 through the access device 58. It should be understood that the particular form of memory cells 56 are provided only as examples, and the embodiments described above are not limited to these types of memory cells.

In memory array 150, each local word line 52 (e.g., WL 0-WL7) is electrically connected to a respective local line driver 80A-80H in word line driver block 160. Local word line drivers 80A-80H are connected to a global word line 62 that is driven by a global word line driver 60, which may be configured in a manner similar to line driver 60 described above in connection with FIGS. 3 and 4. A voltage Vout (FIG. 3) provided on global word line 62 drives local word line drivers 80A-80H. The voltage Vout may be inverted at local word line drivers 80A-80H and provided as a word line voltage WL on local word lines 52. In another embodiment, each local word line driver 80A-80H may be connected to and driven by a separate global word line driver 60 by a separate global word line 62. In yet another embodiment, each local word line driver 80A-80H is configured in a manner similar to line driver 60, described above with regard to FIG. 3, and no global word line driver is provided.

The above description and drawings are only to be considered illustrative of specific embodiments, which achieve the features and advantages described herein. Modification and substitutions to specific circuits, components, structures, and processes can be made. For example, it should be understood that appropriate types of memory cells, appropriate control signals, and appropriate voltage levels other than those specifically described in connection with the above embodiments may be used. Accordingly, the embodiments of the invention are not to be considered as being limited by the foregoing description and drawings, but only by the scope of the appended claims.

What is claimed as new and desired to be protected by Letters Patent of the United States is:

1. A line driver comprising:
    a voltage selection circuit configured to provide a line voltage from one of a first power control circuit and a second power control circuit to a line of a memory array according to a received gate voltage, said voltage selection circuit comprising:
        a first voltage selection transistor with a first source/drain coupled to said first power control circuit and a second source/drain coupled to said line; and
        a second voltage selection transistor with a first source/drain coupled to said line and a second source/drain coupled to said second power control circuit; and
    a gate voltage selection circuit configured to provide said gate voltage to a node of said voltage selection circuit, said gate voltage selection circuit comprising:
        a first gate voltage selection transistor with a first source/drain coupled to said first power control circuit and a second source/drain coupled to said node of said voltage selection circuit; and
        a second gate voltage selection transistor with a first source/drain coupled to said node of said voltage selection circuit and a second source/drain commonly coupled with said second source/drain of said second voltage selection transistor,
    wherein said first power control circuit provides different first and second pull-up voltages and said second power control circuit provides different first and second pull-down voltages, depending upon a state of the memory array.

2. The line driver of claim 1, wherein said second source/drain of said second gate voltage selection transistor is directly coupled to said second source/drain of said second voltage selection transistor.

3. The line driver of claim 1, wherein said second source/drain of said second gate voltage selection transistor is coupled to said second power control circuit.

4. The line driver of claim 1, wherein said second power control circuit is configured to:
    provide said first pull-down voltage when the memory array is in an active mode; and
    provide said second pull-down voltage when the memory array is in an inactive mode.

5. The line driver of claim 4, wherein said first pull-down voltage is a negative voltage and said second pull-down voltage is a positive voltage.

6. The line driver of claim 4, wherein said first pull-down voltage is a negative voltage and said second pull-down voltage is a ground level voltage.

7. The line driver of claim 4, wherein said first power control circuit is configured to:
    provide said first pull-up voltage when the memory array is in an active mode; and
    provide said second pull-up voltage when the memory array is in an inactive mode.

8. The line driver of claim 7, wherein said first pull-up voltage is a positive voltage that is greater than said second pull-up voltage.

9. The line driver of claim 8, wherein said first and second pull-up voltages are greater than said second pull-down voltage.

10. The line driver of claim 4, wherein said first pull-down voltage is a negative voltage and said second pull-down voltage is a ground level voltage.

11. The line driver of claim 1, wherein said voltage selection circuit is configured to output a voltage from said first power control circuit as said line voltage during an inactive period.

12. The line driver of claim 1, wherein said node of said voltage selection circuit comprises a common gate node of said first voltage selection transistor and said second voltage selection transistor.

13. The line driver of claim 1, wherein said first voltage selection transistor is a PMOS device and said second voltage selection transistor is an NMOS device.

14. The line driver of claim 1, wherein said first gate voltage selection transistor is a PMOS device and said second gate voltage selection circuit is an NMOS device.

15. The line driver of claim 1, wherein said line driver is configured to provide a line voltage to a control line of said memory array.

16. The line driver of claim 15, wherein said line driver is a global word line driver configured to provide a line voltage to a global word line of said memory array.

17. The line driver of claim 15, wherein said line driver is a local word line driver configured to provide a line voltage to a local word line of said memory array.

18. A method of operating a line driver of a memory array, said line driver comprising a voltage selection circuit for providing a line voltage and a gate voltage selection circuit for providing a gate voltage to said voltage selection circuit, said method comprising, during an inactive period of said line driver:
providing a first of two different pull-up voltages to a source/drain of a first transistor of said voltage selection circuit;
providing a first of two different pull-down voltages to a source/drain of a second transistor of said voltage selection circuit; and
providing a gate voltage to said voltage selection circuit to control said voltage selection circuit to provide substantially said first pull-up voltage as said line voltage,
wherein said gate voltage substantially comprises said first pull-down voltage.

19. The method of claim 18, further comprising, during an active period of said line driver when the line driver is being used to access a memory cell of the memory array:
providing a second pull-up voltage to said source/drain of said first transistor;
providing a second pull-down voltage to said source/drain of said second transistor; and
providing a second gate voltage to said voltage selection circuit to control said voltage selection circuit to provide substantially said second pull-down voltage as said line voltage.

20. The method of claim 18, wherein providing said gate voltage to said voltage selection circuit further comprises:
providing said first pull-down voltage to a source/drain of a gate voltage selection transistor in said gate voltage selection circuit; and
controlling a gate of said gate voltage selection transistor to conduct, thereby providing said gate voltage from a second source/drain of said gate voltage selection transistor to said voltage selection circuit.

21. The method of claim 19, wherein providing said second gate voltage to said voltage selection circuit further comprises:
providing said second pull-up voltage to a first source/drain of a gate voltage selection transistor in said gate voltage selection circuit; and
controlling a gate of said gate voltage selection transistor to conduct, thereby providing said gate voltage from a second source/drain of said gate voltage selection transistor to said voltage selection circuit.

22. The method of claim 18, wherein said act of providing said gate voltage to said voltage selection circuit further comprises providing said gate voltage to a common gate of said first transistor and said second transistor.

23. The method of claim 19, wherein said first pull-down voltage is a negative voltage and said second pull-down voltage is a positive voltage.

24. The method of claim 19, wherein said first pull-down voltage is a negative voltage and said second pull-down voltage is a ground voltage.

25. The method of claim 19, wherein said second pull-up voltage is a higher voltage than said first pull-up voltage.

26. The method of claim 18, wherein said line driver outputs a line voltage to a control line of a memory array.

27. The method of claim 26, wherein said line driver outputs a line voltage to a global word line of a memory array.

28. The method of claim 26, wherein said line driver outputs a line voltage to a local word line of a memory array.

29. An apparatus comprising:
a memory array comprising memory cells, each of said memory cells being electrically connected to a respective control line; and
a driver block containing a plurality of line drivers, each of said line drivers being configured to drive a line voltage on at least one of said control lines, at least one of said line drivers comprising:
a voltage selection circuit configured to provide a line voltage from one of a first power control circuit and a second power control circuit to said respective control line according to a received gate voltage, said voltage selection circuit comprising:
a first voltage selection transistor with a first source/drain coupled to said first power control circuit and a second source/drain coupled to said respective control line; and
a second voltage selection transistor with a first source/drain coupled to said respective control line and a second source/drain coupled to said second power control circuit;
a gate voltage selection circuit configured to provide said gate voltage to a node of said voltage selection circuit, said gate voltage selection circuit comprising:
a first gate voltage selection transistor with a first source/drain coupled to said first power control circuit and a second source/drain coupled to said node of said voltage selection circuit; and
a second gate voltage selection transistor with a first source/drain coupled to said node of said voltage selection circuit and a second source/drain commonly coupled with said second source/drain of said second transistor of said voltage selection circuit,
wherein said first power control circuit provides different first and second pull-up voltages and said second power control circuit provides different first and second pull-down voltages, depending upon a state of the memory array.

30. The apparatus of claim 29, wherein said second source/drain of said second gate voltage selection transistor is directly coupled to said second source/drain of said second voltage selection transistor.

31. The apparatus of claim 29, wherein said second source/drain of said second gate voltage selection transistor is coupled to said second power control circuit.

32. The apparatus of claim 29, further comprising:
a processor configured to provide address information to a decoder block of said apparatus,
wherein said decoder block is configured to control said line drivers of said driver block to activate at least one line driver of said plurality of line drivers according to said address information during an active period.

33. The apparatus of claim 32, wherein said driver block is configured to not activate any line drivers of said plurality of line drivers during an inactive period.

34. The apparatus of claim 33, wherein said second power control circuit is configured to:
provide said first pull-down voltage during said active period; and
provide said second pull-down voltage during said inactive period.

35. The apparatus of claim 34, wherein said first power control circuit is configured to:
provide said first pull-up voltage during said active period; and
provide said second pull-up voltage during said inactive period.

36. The apparatus of claim 34, wherein said first pull-down voltage is a negative voltage and said second pull-down voltage is a positive voltage.

37. The apparatus of claim 34, wherein said first pull-down voltage is a negative voltage and said second pull-down voltage is a ground voltage.

38. The apparatus of claim 29, wherein said plurality of line drivers comprises a plurality of control line drivers.

* * * * *